(12) United States Patent
Takashina et al.

(10) Patent No.: US 11,203,713 B2
(45) Date of Patent: Dec. 21, 2021

(54) PHOSPHOR, LIGHT-EMITTING DEVICE, IMAGE DISPLAY DEVICE, AND ILLUMINATION DEVICE

(71) Applicant: MITSUBISHI CHEMICAL CORPORATION, Chiyoda-ku (JP)

(72) Inventors: Shiho Takashina, Chiyoda-ku (JP); Masahito Isaka, Chiyoda-ku (JP); Atsushi Oishi, Chiyoda-ku (JP); Naoyuki Komuro, Chiyoda-ku (JP); Ryuichi Hasegawa, Chiyoda-ku (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 43 days.

(21) Appl. No.: 16/805,899

(22) Filed: Mar. 2, 2020

(65) Prior Publication Data

US 2020/0199448 A1 Jun. 25, 2020

Related U.S. Application Data

(63) Continuation of application No. PCT/JP2018/032656, filed on Sep. 3, 2018.

(30) Foreign Application Priority Data

Sep. 4, 2017 (JP) .............................. JP2017-169647

(51) Int. Cl.
*C09K 11/77* (2006.01)
*C09K 11/08* (2006.01)
(Continued)

(52) U.S. Cl.
CPC ...... *C09K 11/7734* (2013.01); *C09K 11/0883* (2013.01); *C09K 11/77348* (2021.01);
(Continued)

(58) Field of Classification Search
CPC ............. C09K 11/77348; H01L 33/502; G02F 1/1336; G02F 1/133614
See application file for complete search history.

(56) References Cited

U.S. PATENT DOCUMENTS 9,120,974 B2 * 9/2015 Hong ..................... H05B 33/12
2008/0297031 A1 12/2008 Takahashi et al.
(Continued)

FOREIGN PATENT DOCUMENTS

JP 2006-282809 A 10/2006
JP 2009-256427 A 11/2009
(Continued)

OTHER PUBLICATIONS

International Search Report dated Nov. 27, 2018 in PCT/JP2018/032656 filed on Sep. 3, 2018, 2 pages.
(Continued)

*Primary Examiner* — C Melissa Koslow
(74) *Attorney, Agent, or Firm* — Oblon, McClelland, Maier & Neustadt, L.L.P.

(57) ABSTRACT

Provided is a phosphor that includes a crystal phase represented by the following Formula [1] and has a microstrain of 0.049% or less as calculated by the Halder-Wagner method: $Eu_a Si_b Al_c O_d N_e$ [1] (wherein, a, b, c, d, and e represent values satisfying the following respective ranges: $0<a\le 0.2$, $5.6<b\le 5.994$, $0.006\le c<0.4$, $b+c=6$, $0.006\le d<0.4$, and $7.6<e\le 7.994$).

11 Claims, 2 Drawing Sheets

(51) Int. Cl.
*G02F 1/13357* (2006.01)
*H01L 33/50* (2010.01)
*G02F 1/1335* (2006.01)

(52) U.S. Cl.
CPC .......... *G02F 1/1336* (2013.01); *H01L 33/504* (2013.01); *G02F 1/133614* (2021.01)

(56) References Cited

U.S. PATENT DOCUMENTS

| | | |
|---|---|---|
| 2010/0053932 A1 | 3/2010 | Emoto et al. |
| 2011/0121234 A1 | 5/2011 | Hirosaki |
| 2012/0176568 A1 | 7/2012 | Hirosaki |
| 2013/0200777 A1 | 8/2013 | Inagaki et al. |
| 2013/0241397 A1 | 9/2013 | Hong et al. |

FOREIGN PATENT DOCUMENTS

| | | |
|---|---|---|
| JP | 2010-270196 A | 12/2010 |
| JP | 2012-082269 A | 4/2012 |
| JP | 2013-173868 A | 9/2013 |
| JP | 2016-132774 A | 7/2016 |
| WO | WO 2007/066733 A1 | 6/2007 |
| WO | WO 2008/062781 A1 | 5/2008 |
| WO | WO 2012/033122 A1 | 3/2012 |
| WO | WO 2012/043567 A1 | 4/2012 |
| WO | WO 2013/108782 A1 | 7/2013 |

OTHER PUBLICATIONS

English translation of the International Preliminary Report on Patentability (Chapter 1) dated Nov. 27, 2018 in PCT/JP2018/032656, 7 pages.

* cited by examiner

PHOSPHOR, LIGHT-EMITTING DEVICE, IMAGE DISPLAY DEVICE, AND ILLUMINATION DEVICE

CROSS-REFERENCE TO RELATED APPLICATION

This is a continuation of International Application PCT/JP2018/032656, filed on Sep. 3, 2018, and designated the U.S., and claims priority from Japanese Patent Application 2017-169647 which was filed on Sep. 4, 2017, the entire contents of which are incorporated herein by reference.

TECHNICAL FIELD

The present invention relates to a phosphor, a light-emitting device, an image display device, and an illumination device.

BACKGROUND ART

With the recent trend of energy conservation, there is an increasing demand for lightings and backlights that use LEDs. The LEDs used for such applications are white light-emitting LEDs in which phosphors are disposed on an LED chip that emits a light of a blue or near-ultraviolet wavelength.

As white light-emitting LEDs of such a type, LEDs in which red light-emitting nitride phosphors and green light-emitting phosphors that utilize a blue light emitted from a blue LED chip as an excitation light are disposed on the blue LED chip have been used recently.

Particularly, in display applications, among these three colors of blue, green and red, green is especially more important than other two colors since it is particularly highly visible to human eye and greatly contributes to the brightness of the whole display; therefore, the development of a green phosphor having excellent emission characteristics is desired.

As green phosphors, phosphors such as nitrides and oxynitrides have been drawing attention and, especially, β-type sialon phosphors have been actively developed.

For example, in Patent Document 1, it is disclosed to improve the emission luminance of a β-sialon phosphor by allowing the phosphor to have a specific amount of variation in its composition formula. Further, in Patent Document 2, it is disclosed that a β-sialon phosphor containing La has a high emission luminance.

Meanwhile, Patent Document 3 discloses a method of producing a phosphor in which crystal defect density is reduced by performing a specific treatment.

PRIOR ART DOCUMENTS

Patent Document

Patent Document 1: WO 2012/043567 A1
Patent Document 2: JP 2016-132774 A
Patent Document 3: WO 2008/062781 A1

SUMMARY OF THE INVENTION

Problem to be Solved by the Invention

However, according to the studies conducted by the present inventors, since the β-sialon phosphors disclosed in Patent Documents 1, 2 or 3 do not have sufficient emission characteristics, the emission efficiency of a light-emitting device having such a β-sialon phosphor is inadequate in some cases. Moreover, in Patent Documents 1, 2 or 3, studies were conducted focusing on improvement of the emission luminance; however, according to the studies conducted by the present inventors, it was found that conventional β-type sialon phosphors have a problem of being inadequate in terms of the reliability when used in a light-emitting device, particularly the emission characteristics such as the change in chromaticity caused by long-term use.

That is, an object of the present invention is to provide a β-type sialon phosphor having excellent emission characteristics. Another object of the present invention is to provide a highly reliable light-emitting device having a high emission efficiency, as well as a high-quality illumination device and a high-quality image display device.

Means for Solving the Problems

The present inventors intensively studied to discover that the above-described problems can be solved by a β-type sialon phosphor having a microstrain calculated by the Halder-Wagner method in a specific range, thereby arriving at the present invention.

That is, the present invention encompasses the following <1> to <7>.

<1> A phosphor comprising a crystal phase represented by the following Formula [1] and having a microstrain of 0.049% or less as calculated by the Halder-Wagner method:

$$Eu_aSi_bAl_cO_dN_e \qquad [1]$$

(wherein, a, b, c, d, and e represent values satisfying the following respective ranges:
0<a≤0.2,
5.6<b≤5.994,
0.006≤c<0.4,
b+c=6,
0.006≤d<0.4, and
7.6<e≤7.994).

<2> A phosphor comprising a crystal phase represented by the following Formula [1] and having a microstrain of 0.020% or less as calculated by the Halder-Wagner method:

$$Eu_aSi_bAl_cO_dN_e \qquad [1]$$

(wherein, a, b, c, d, and e represent values satisfying the following respective ranges:
0<a≤0.2,
5.6<b≤5.994,
0.006≤c<0.4,
b+c=6,
0.006≤d<0.4, and
7.6<e≤7.994).

<3> The phosphor according to <1> or <2>, having a crystallite size of 100 nm or larger.

<4> The phosphor according to any one of <1> to <3>, wherein the microstrain is not less than 0.002%.

<5> The phosphor according to any one of <1> to <4>, exhibiting an emission peak in a wavelength range of 500 nm or more to 560 nm or less when irradiated with an excitation light having a wavelength of 300 nm or more to 500 nm or less.

<6> The phosphor according to any one of <1> to <5>, having a full width at half maximum of 55 nm or smaller in an emission spectrum.

<7> A light-emitting device comprising: a first illuminant; and a second illuminant that emits a visible light when irradiated with a light emitted from the first illuminant, wherein the second illuminant comprises, as a first phosphor, at least one phosphor according to any one of <1> to <6>.

<8> An illumination device comprising the light-emitting device according to <7> as a light source.

<9> An image display device comprising the light-emitting device according to <7> as a light source.

Advantageous Effects of Invention

According to the present invention, a β-type sialon phosphor being excellent in emission characteristics, particularly the reliability when used in a light-emitting device, can be provided. In addition, the β-type sialon phosphor of the present invention can provide a highly reliable light-emitting device having a high emission efficiency, as well as a high-quality illumination device and a high-quality image display device.

DESCRIPTION OF EMBODIMENTS

Figure 1:
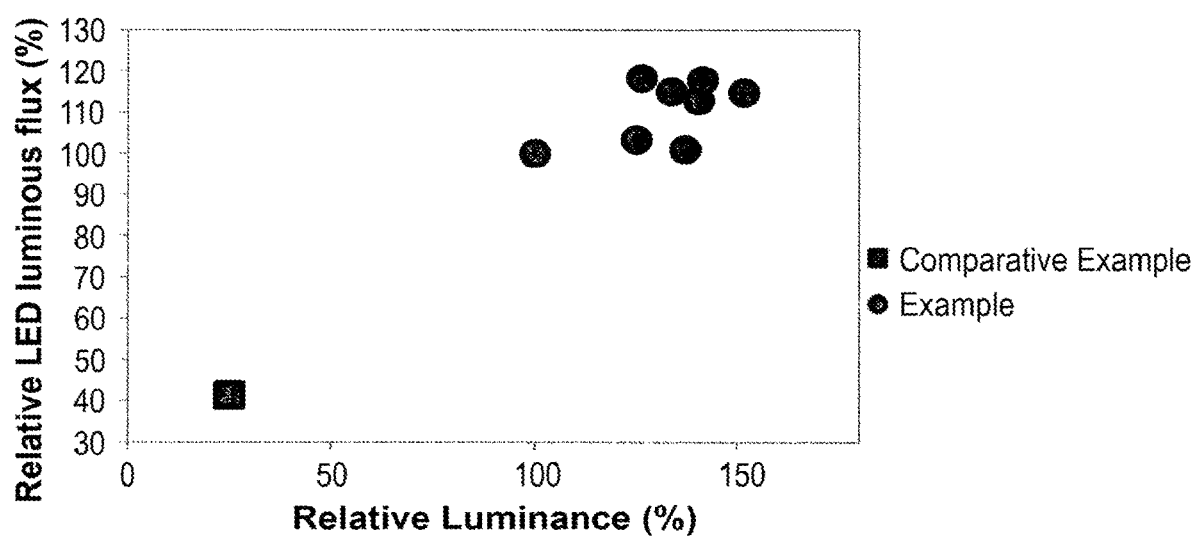
FIG. 1 is a graph obtained by plotting the values of relative LED luminous flux against the values of relative luminance for the phosphors obtained in Examples and Comparative Examples.

The present invention will now be described referring to embodiments and examples thereof; however, the present invention is not restricted to the below-described embodiments, examples and the like and can be carried out with any modification within a range that does not depart from the gist of the present invention.

In the present specification, those numerical ranges expressed with "to" each denote a range that includes the numerical values stated before and after "to" as the lower and upper limit values, respectively. Further, the composition formulae of phosphors in the present specification are separated from each other by commas. When plural elements separated by commas are enumerated in parentheses, it means that the phosphor of interest may contain one or more of the enumerated elements in any combination and any composition. For instance, a composition formula "(Ca,Sr,Ba)Al$_2$O$_4$:Eu" comprehensively represents all of "CaAl$_2$O$_4$:Eu", "SrAl$_2$O$_4$:Eu", "BaAl$_2$O$_4$:Eu", "Ca$_{1-x}$Sr$_x$Al$_2$O$_4$:Eu", "Sr$_{1-x}$Ba$_x$Al$_2$O$_4$:Eu", "Ca$_{1-x}$Ba$_x$Al$_2$O$_4$:Eu", and "Ca$_{1-x-y}$Sr$_x$Ba$_y$Al$_2$O$_4$:Eu" (provided that 0<x<1, 0<y<1, and 0<x+y<1).

The present invention relates to a phosphor, a light-emitting device, an illumination device and an image display device, which are described below in detail in the order mentioned.

{Phosphor}
[Regarding Formula [1]]

The β-type sialon phosphor of the present invention includes a crystal phase represented by the following Formula [1]:

$$Eu_aSi_bAl_cO_dN_e \qquad [1]$$

(wherein, a, b, c, d, and e represent values satisfying the following respective ranges:
0<a≤0.2,
5.6<b≤5.994,
0.006≤c<0.4,
b+c=6,
0.006≤d<0.4, and
7.6<e≤7.994).

In Formula [1], Eu represents europium. Eu may be partially activated by other activation element, such as manganese (Mn), cerium (Ce), praseodymium (Pr), neodymium (Nd), samarium (Sm), terbium (Tb), dysprosium (Dy), holmium (Ho), erbium (Er), thulium (Tm), or ytterbium (Yb).

In Formula [1], Si represents silicon. Si may be partially substituted with other quadrivalent element, such as germanium (Ge), tin (Sn), titanium (Ti), zirconium (Zr), or hafnium (Hf).

In Formula [1], Al represents aluminum. Al may be partially substituted with other trivalent element, such as boron (B), gallium (Ga), indium (In), scandium (Sc), yttrium (Y), lanthanum (La), gadolinium (Gd), or lutetium (Lu).

In Formula [1], O represents an oxygen element, and N represents a nitrogen element. O and/or N may partially contain other element, such as a halogen element (fluorine (F), chlorine (Cl), bromine (Br), or iodine (I)). The expression "contain an element" used herein refers to both a mode in which the element is substituted and a mode in which the element is contained without being substituted.

With regard to the halogen element, a case where a halogen element is incorporated into a raw material metal as an impurity and a case where a halogen element is introduced during the production process, such as the pulverization step or the nitridation step, are considered. Particularly, when a halide is used as a flux, there are cases where a halogen element is incorporated into the resulting phosphor. From the standpoint of allowing the phosphor to have acceptable emission characteristics, the amount of the halogen element in the crystal phase represented by Formula [1] is preferably 1% by mass or less, more preferably 0.5% by mass or less.

In Formula [1], "a" represents the content of Eu, and the range thereof is usually 0<a≤0.2. The lower limit value thereof is preferably 0.0001, more preferably 0.001, while the upper limit value is preferably 0.15, more preferably 0.1, particularly preferably 0.08.

Further, "b" represents the content of Si, and the range thereof is usually 5.6<b≤5.994. The lower limit value thereof is preferably 5.7, while the upper limit value is preferably 5.990, more preferably 5.980.

In Formula [1], "c" represents the content of Al, and the range thereof is usually 0.006≤c<0.4. The lower limit value thereof is preferably 0.010, more preferably 0.020, while the upper limit value is preferably 0.3.

The value of "b+c" represents the total content of Al and Si, which is usually 6.

Further, "d" represents the content of O, and the range thereof is usually 0.006≤d<0.4. The lower limit value thereof is preferably 0.010, more preferably 0.020, while the upper limit value is preferably 0.3.

Moreover, "e" represents the content of N, and the range thereof is usually 7.6<e≤7.994. The lower limit value thereof is preferably 7.7, while the upper limit value is preferably 7.990, more preferably 7.980.

All of the content values are preferably in the above-described respective ranges from the standpoint of allowing the resulting phosphor to have good emission characteristics.

The composition of the phosphor can be verified by a commonly known method. For example, the composition of the phosphor can be determined by identification of the crystal phase based on X-ray diffractometry (XRD), fluorescent X-ray analysis (XRF), composition analysis (SEM-EDS) using a scanning electron microscope and an energy dispersive X-ray spectrometer, composition analysis using an electron-beam microanalyzer (EPMA), inductively-coupled plasma optical emission spectrometry (ICP-OES), inductively-coupled plasma mass spectrometry (ICP-MS), atomic absorption spectrophotometry (AAS), or ion chromatography (IC).

β-type sialon is generally represented by a general formula $Si_{6-x}Al_xO_xN_{8-x}$. That is, the composition of β-type sialon preferably has a ratio of Al and O (oxygen), which is a stoichiometric composition, of 1:1. In other words, the molar ratio of Al and O is preferably 1:1 in accordance with stoichiometry. However, in a β-type sialon phosphor, when $Eu^{2+}$ ions acting as emission center are solid-dissolved in the crystal, an excess or deficiency (a change in the value of x representing the composition ratio of Al) occurs in terms of the charge balance.

An acceptable range of such excess or deficiency is usually 30%, preferably 20%, more preferably 10% or greater, particularly preferably about 10%. A phosphor can be used as long as the excess or deficiency is in this range, and the excess or deficiency may be in any range as long as the phosphor has the same crystal structure as that of a β-type sialon phosphor.

[Microstrain and Crystallite Size]

The phosphor of the present invention has a microstrain, which is calculated by the Halder-Wagner method, of usually 0.049% or less. Further, the phosphor of the present invention preferably has a crystallite size of 100 nm or larger.

In the present invention, the microstrain (crystal lattice distortion) represents a variation in the lattice spacing of the phosphor, and a smaller value means less strain in the phosphor crystal. For example, the local conditions around Si and Eu can be evaluated based on the evaluation of the crystal state by electron spin resonance (ESR) method, while a change in the state of a host crystal itself and a change in the state of the host crystal that is associated with solid-dissolution of Eu can be comprehensively evaluated based on the microstrain calculated by the Halder-Wagner method; therefore, presumably, the microstrain can be used more suitably for the evaluation of properties, such as the reliability that is affected by local changes around elemental Eu and the like as well as changes in the host crystal as a whole.

In the phosphor of the present invention, the microstrain is usually 0.049% or less, preferably 0.036% or less, more preferably 0.030% or less, still more preferably 0.025% or less, particularly preferably 0.020% or less. Good properties can be attained when the microstrain is the above-described value or less. The lower limit value of the microstrain is usually larger than 0, preferably not less than 0.002%.

In the present invention, a crystallite represents a largest aggregation that can be deemed as a single crystal, and a larger crystallite size means higher crystallinity.

In the phosphor of the present invention, the crystallite size is preferably 100 nm or larger, more preferably 105 nm or larger, still more preferably 108 nm or larger. The upper limit thereof is usually not larger than the particle size of the phosphor, specifically 1,000 nm or smaller.

(Calculation Method)

As the Halder-Wagner method in the present invention, for example, the method described in "Fujio Izumi and Takuji Ikeda, Advanced Ceramics Research Center Annual Report (2014) Vol. 3, p. 33-38" (Reference Document 1) or the like may be employed.

The crystallite size and the microstrain can be calculated using a multi-purpose pattern-fitting system RIETAN-FP. In the Halder-Wagner method shown in the manual of this system "New Functions of RIETAN-FP, Rietan-FP Manual, p. 27" (Reference Document 2), the crystallite size and the microstrain can be calculated by the following equation from an integral width β (a value obtained by dividing the peak area by the peak intensity), an incident wavelength λ, and a diffraction peak θ.

$$\left(\frac{\beta}{\tan\theta}\right)^2 = \frac{K\lambda}{D}\frac{\beta}{\tan\theta\sin\theta} + 16\varepsilon^2$$

When $(\beta/\tan\theta)^2$ and $\beta/(\tan\theta\sin\theta)$ are two-dimensionally plotted on the ordinate and the abscissa, respectively, the crystallite size D and the microstrain ε can be determined from the slope of the approximate straight line and the ordinate intercept, respectively. This method is very simple and has a high numerical accuracy since it estimates the crystallite size and the microstrain as calculated statistical values of all diffraction peaks and integral widths without relying on a fitting function of a diffraction profile.

Conventionally, it is known that the crystallite size can be calculated using the Scherrer equation after approximately determining two-dimensional profile parameters U, V, W, P, X, Xe, Y and Ye using the equation of Caglioti et al. and a pseudo-Voigt function of TCH from the diffraction peak angle θ and the full width at half maximum (FWHM) obtained by profile fitting of X-ray diffraction pattern (Izumi Nakai and Fujio Izumi, "Practice of Powder X-Ray Analysis", Asakura Publishing Co., Ltd., P. 164).

However, the calculation method using the Scherrer equation has problems in that, for example, the profile parameters are strongly correlated with one another and thus refining thereof takes time for performing the calculation with high accuracy. Further, because of the use of a physically meaningful function, there is also a problem of a notable reduction in the accuracy when the diffraction peak has an asymmetrical shape.

(Reasons why Such Effects are Exerted)

The reasons why the phosphor of the present invention exerts an effect of exhibiting excellent emission characteristics, particularly excellent reliability when used in a light-emitting device, are presumed as follows.

A β-type sialon phosphor usually has a structure in which elemental Eu, which is an activation element, is arranged in a host crystal represented by a general formula $Si_{6-x}Al_xO_xN_{8-x}$. As disclosed in Reference Document 3 (Applied Physics Letters 94, 041908_2009) and the like, it has been understood that a β-type sialon phosphor has a structure in which elemental Eu is arranged in a space inside the lattice of the host crystal, rather than replacing an element of the lattice. Accordingly, it is believed that a strain is like to be generated in the whole β-type sialon phosphor containing the host crystal. In the phosphor of the present invention, however, since not only a change in the strain of the local atomic arrangement around the elemental Eu arranged inside the lattice but also the strain of the whole host crystal are reduced, it is believed that the strain of the crystal phase of the phosphor as a whole is small.

With the strain of the whole crystal phase of the phosphor being small, the lattice of the host crystal surrounding Eu arranged therein is hardly deformed when the phosphor is used in a light-emitting device and exposed to heat and the like over a long period; therefore, it is believed that a change in the environment (e.g., atomic arrangement) around Eu is suppressed and the elemental Eu arranged inside the lattice of the host crystal is thus likely to maintain its initial state (the state immediately after the production), whereby an effect of making a change in the emission characteristics unlikely to occur is exerted in the evaluation of long-term reliability.

On the other hand, in a host crystal having a large strain, the lattice of the host crystal surrounding Eu arranged therein is likely to be deformed when the phosphor is used in a light-emitting device and exposed to heat and the like over a long period; therefore, it is surmised that a change in the environment (e.g., atomic arrangement) around the elemental Eu is not suppressed and the elemental Eu is thus unlikely to maintain its initial state.

In other words, in the phosphor of the present invention that has a microstrain of not greater than a specific value, the strain of the host crystal is small, and elemental Eu contributing to light emission is arranged in the lattice of the host crystal such that a stable state can be maintained even in long-term use; therefore, the phosphor of the present invention can be viewed as a high-quality phosphor that shows only a minor change in the emission characteristics over a long period when used in a light-emitting device.

{Physical Properties of Phosphor}
[Emission Color]

The phosphor of the present invention is, by adjusting its chemical composition and the like, allowed to have a desired emission color, such as green, yellowish green or yellow, when excited with a light having a wavelength of 300 nm to 500 nm in the near-ultraviolet to blue region.

[Emission Spectrum]

The emission peak wavelength and the shape thereof vary depending on the chemical composition of the phosphor, particularly the amount of Al and O; however, for example, when the phosphor of the present invention contains Eu as an activation element, in view of the use thereof as a green, yellowish green or yellow phosphor, the emission spectrum of the phosphor, which is measured when the phosphor is excited with a light having a peak wavelength of 455 nm, preferably has the following characteristics.

First, in the above-described emission spectrum of the phosphor, the peak wavelength $\lambda p$ (nm) is usually 500 nm or longer, preferably 510 nm or longer, more preferably 520 nm or longer, but usually 560 nm or shorter, preferably 550 nm or shorter, more preferably 545 nm or shorter. The peak wavelength $\lambda p$ (nm) is preferably in this range since good emission characteristics of green light are thereby attained.

Further, in the above-described emission spectrum of the phosphor, the full width at half maximum of an emission peak (hereinafter, abbreviated as "FWHM" as appropriate) is usually 45 nm or greater, but preferably less than 90 nm, more preferably 85 nm or less, still more preferably 70 nm or less, particularly preferably 55 nm or less. The FWHM is preferably in this range since, when the phosphor of the present invention is applied to a light-emitting device, the light-emitting device exhibits both good color rendering properties and good emission efficiency.

For excitation of the phosphor with a light having a peak wavelength of 455 nm, for example, a GaN-based light-emitting diode can be used. Further, the emission spectrum of the phosphor of the present invention can be measured using, for example, a fluorescence spectrometer (manufactured by JASCO Corporation) equipped with a 150-W xenon lamp as an excitation light source and a multi-channel CCD detector C7041 (manufactured by Hamamatsu Photonics K.K.) as a spectrometer. The emission peak wavelength and the full width at half maximum of the emission peak can be calculated from the thus obtained emission spectrum.

[Quantum Efficiency]

In the phosphor obtained by the present invention, the higher the internal quantum efficiency, the more preferred it is. The value of the internal quantum efficiency is usually 50% or higher, preferably 60% or higher.

In the phosphor obtained by the present invention, the higher the excitation light absorption efficiency, the more preferred it is. The value of the excitation light absorption efficiency is usually 40% or higher, preferably 50% or higher. When the excitation light absorption efficiency is low, the emission efficiency tends to be reduced.

In the phosphor obtained by the present invention, the higher the external quantum efficiency, the more preferred it is. The value of the external quantum efficiency is usually 30% or higher, preferably 35% or higher, more preferably 40% or higher. When the external quantum efficiency is low, the emission efficiency tends to be reduced.

[Particle Size]
(Weight Median Diameter D50 and Standard Deviation Thereof)

The weight median diameter D50 and the standard deviation thereof are both values relating to particle size.

In the present invention, the weight median diameter D50 (hereinafter, referred to as "median diameter D50" or "D50") is defined as follows.

The median diameter D50 is a value determined from a weight-based particle size distribution curve obtained by measuring the particle size distribution by a laser diffraction/scattering method. Specifically, the phosphor is dispersed in an aqueous solution containing a dispersant, and the particle size distribution is measured in a particle size range of 0.1 μm to 600 μm using a laser diffraction-type particle size distribution analyzer. The median diameter D50 means a particle size at a cumulative value of 50% in the thus obtained weight-based particle size distribution curve. In the same manner, the particle sizes at cumulative values of 25% and 75% in the weight-based particle size distribution curve are hereinafter denoted as "D25" and "D75", respectively.

The median diameter D50 of the phosphor of the present invention is usually 1 μm or larger, preferably 5 μm or larger, but usually 50 μm or smaller, preferably 40 μm or smaller. As the median diameter D50, it is preferred to select a particle size in accordance with, for example, the intended use of the phosphor, a phosphor to be used in combination, and the configuration of the device to which the phosphor is applied. The median diameter D50 is particularly preferably in a range of 5 μm to 15 μm when emphasis is placed on the ease of handling, or in a range of 15 μm to 40 μm when emphasis is placed on the luminance of the phosphor itself.

[CIE Chromaticity Coordinates]

When the emission color of the phosphor of the present invention is expressed in CIE chromaticity coordinates, the value of x is usually 0.270 or larger, preferably 0.275 or larger, more preferably 0.280 or larger, but usually 0.380 or smaller, preferably 0.375 or smaller, more preferably 0.370 or smaller. When the value of x is excessively small, the emission color tends to be greenish and the luminance tends to be reduced. Meanwhile, when the value of x is excessively large, the emission color tends to be yellowish and the color reproduction range tends to be narrow.

Further, when the emission color of the phosphor of the present invention is expressed in CIE chromaticity coordinates, the value of y is usually 0.600 or larger, preferably 0.605 or larger, more preferably 0.610 or larger, but usually 0.630 or smaller, preferably 0.625 or smaller, more preferably 0.620 or smaller. When the value of y is excessively small, the color reproduction range tends to be narrow, whereas when the value of y is excessively large, the luminance tends to be reduced.

{Phosphor Production Method}

Raw materials, phosphor production method and the like used for obtaining the phosphor of the present invention are as follows.

A method of producing the phosphor of the present invention is not particularly restricted; however, the phosphor of the present invention can be produced by, for example, mixing a raw material of Eu that is an activation element (hereinafter, referred to as "Eu source" as appropriate), a raw material of Si (hereinafter, referred to as "Si source" as appropriate) and a raw material of Al (hereinafter, referred to as "Al source" as appropriate) (mixing step), and subsequently firing the resulting mixture (firing step).

[Phosphor Raw Materials]

As phosphor raw materials used for producing the phosphor of the present invention, know materials can be used and, for example, silicon nitride ($Si_3N_4$), aluminum nitride (AlN), silicon oxide ($SiO_2$) and/or aluminum oxide ($Al_2O_3$), as well as an Eu compound selected from metal, oxide, carbonate, chloride, fluoride, nitride and oxynitride of Eu, can be used. Metal Si may be used as the Si source; however, since this tends to result in a low composition ratio of oxygen in the resulting phosphor, it is preferred to use silicon nitride ($Si_3N_4$) in the present invention.

It is noted here that O (oxygen) and N (nitrogen) in the above-described Formula [1] may be supplied from the Si source, the Al source or the Eu source, and N may be supplied from the firing atmosphere as well. Further, the raw materials may contain unavoidable impurities.

(Mixing Step)

The phosphor raw materials are weighed such that an intended composition can be attained, and thoroughly mixed using a ball mill or the like to obtain a phosphor raw material mixture (mixing step). In the present invention, it is preferred to thoroughly mix the raw materials such that the constituents (particularly Eu that is an activation element) are uniformly distributed, and this makes it easier to obtain the phosphor of the present invention that has a small microstrain.

As described above, the balance of charge is disturbed when Eu is solid-dissolved in the crystal, and it is believed that the charge of the crystal as a whole is balanced by Si and Al that offset the +2 valence of Eu. For example, when the number of $Si^{4+}$ ions is reduced by two and that of $Al^{3+}$ ions is increased by two, the valence is reduced by two as a whole, and this is believed to offset the solid-dissolution of $Eu^{2+}$. From this perspective, it is preferred that Al and Eu exist in close proximity to each other in the phosphor raw material mixture such that $Al^{3+}$ and $Eu^{2+}$ are close to each other when Eu is solid-dissolved in the crystal.

By thoroughly mixing the phosphor raw materials, Eu is uniformly distributed in the resulting phosphor raw material mixture. This reduces the unevenness of Al and Eu, allowing $Eu^{2+}$ and $Al^{3+}$ to be uniformly distributed upon firing. It is believed that, consequently, when Eu is solid-dissolved in the form of $Eu^{2+}$ in the crystal of the resulting phosphor, the balance of the charge in the crystal is more likely to be maintained, whereby the luminance is improved.

On the other hand, when uneven mixing causes an Al compound to exist in an uneven state without being close to Eu, it is believed that Al does not reach the vicinity of Eu even with ion dispersion during firing, and that the balance of the charge is thus unlikely to be maintained. With the balance of the charge being not maintained, since Eu is unlikely to be solid-dissolved in the form of $Eu^{2+}$ in the crystal, the emission characteristics required for the practical application of the phosphor to a light-emitting device, such as the excitation light absorption efficiency and the emission luminance, tend to be deteriorated. Meanwhile, a phosphor containing a charge-balanced crystal is chemically stable and exhibits excellent emission characteristics.

A method for performing the above-described mixing is not particularly restricted, and specific examples thereof include the following methods (A) and (B):

(A) a dry mixing method in which the above-described phosphor raw materials are pulverized and mixed by a combination of, for example, pulverization using a dry pulverizer, such as a hammer mill, a roll mill, a ball mill, a jet mill or a vibration mill, or a mortar and a pestle, and mixing using a mixer, such as a ribbon blender, a V-type blender, a Henschel mixer or a rocking mixer, or a mortar and a pestle; and (B) a wet mixing method in which a solvent or dispersion medium, such as water, is added to the above-described phosphor raw materials, and the resultant is mixed using, for example, a pulverizer, a mortar and a pestle, or an evaporating dish and a stir bar so as to obtain a solution or a slurry, which is subsequently dried by spray-drying, heat-drying, air-drying or the like.

As a method of mixing the phosphor raw materials, either of the above-described wet mixing method and dry mixing method may be employed, and examples thereof employed for the purpose of avoiding contamination of the phosphor raw materials with moisture include: a dry mixing method; a wet mixing method using a non-aqueous solvent; and a method in which phosphor raw material components that are stable in water are wet-mixed first in an aqueous solvent and then dried, after which raw material components that are unstable in water are added and the resultant is dry-mixed.

In order to thoroughly mix the phosphor raw materials, in the case of employing the above-described method (A), it is preferred to mix the phosphor raw materials for at least a period of longer than 60 minutes, more preferably 90 minutes or longer, still more preferably 120 minutes or longer. In the case of performing the mixing using a sieve, it is preferred to use a sieve having a small mesh size in a range that does not cause separation of the raw materials, and at least the mesh size is preferably 1,000 µm or smaller, more preferably 500 µm or smaller, still more preferably 250 µm or smaller, yet still more preferably 100 µm or smaller, particularly preferably 50 µm or smaller. Further, it is also preferred to mix the phosphor raw materials by a mixing method that involves two steps of mixing and pulverization. In the case of employing the above-described method (B), it is preferred to mix the phosphor raw materials in the state of a solution or a slurry for at least 60 minutes. In addition, in order to thoroughly mix Eu, which is an activation element, into the raw materials, it is preferred to employ, for example, a method of dissolving a water-soluble Eu compound, such as a carbonate, a nitrate, a sulfate or a chloride, into water and subsequently mixing the resultant with other phosphor raw materials.

(Firing Step)

The raw material mixture obtained in the mixing step is fired (firing step). The phosphor raw material mixture is dried as required, subsequently loaded into a container such as a crucible in which at least a surface coming into contact with the raw materials is made of boron nitride, and then fired using a firing furnace, a pressure furnace or the like. The firing temperature cannot be generally prescribed since it varies depending on the desired phosphor composition; however, in general, a phosphor can be stably obtained in a temperature range of 1,820° C. to 2,200° C. A firing temperature of 1,820° C. or higher allows Eu to be incorporated into the resulting β-sialon crystal, so that a phosphor having a sufficient luminance can be obtained. Further, as long as the firing temperature is 2,200° C. or lower, it is not necessary to suppress the decomposition of β-sialon by applying an extremely high nitrogen pressure or to use a special equipment for this purpose, which is industrially preferred. The firing may be performed plural times within the above-described range.

The firing temperature is preferably 1,850° C. or higher, more preferably 1,900° C. or higher, still more preferably 1,950° C. or higher, particularly preferably 2,000° C. or higher, but preferably not higher than 2,200° C., particularly preferably not higher than 2,100° C. The firing atmosphere in the firing step may be any atmosphere as long as the phosphor of the present invention can be obtained; however, it is usually a nitrogen-containing atmosphere. Specific examples thereof include a nitrogen atmosphere and a hydrogen-containing nitrogen atmosphere, and a nitrogen atmosphere is preferred.

The oxygen content of the firing atmosphere may be usually 10 ppm or less, preferably 5 ppm or less. The heating rate is usually 2° C./min or higher, preferably 3° C./min or higher, but usually not higher than 10° C./min, preferably not higher than 5° C./min. It is preferred to control the heating rate to be in this range since the firing time can thereby be prevented from being particularly long.

The firing time varies depending on the temperature, the pressure and the like during firing; however, it is usually 10 minutes or longer, preferably 1 hour or longer, but usually not longer than 48 hours, preferably not longer than 24 hours. The pressure during firing varies depending on the firing temperature and the like; however, it is usually 0.1 MPa or higher, preferably 0.5 MPa or higher, and the upper limit thereof is usually 2.0 MPa or lower, preferably 1.5 MPa or lower. In this range, a pressure of 0.6 MPa to 1.2 MPa or so is industrially convenient and preferred in terms of cost and labor.

With regard to loading of the phosphor raw material mixture into a container, when the loading weight per opening periphery of the container (g/mm) is in a range of 0.1 to 10.0, the reactions from the initial stage to a late stage of firing are facilitated to proceed uniformly by appropriately retaining an atmosphere containing a component involved in the reactions, such as a liquid phase and a vapor phase that contain nitrogen, oxygen, halogen or the like, in the container during firing, whereby a phosphor having a small microstrain is likely to be obtained.

The lower limit value of the loading weight per opening of the container is usually 0.1 or larger, preferably 0.5 or larger, more preferably 0.6 or larger, while the upper limit value is usually 10.0 or smaller.

The "loading weight per opening periphery" of a container is a value obtained by dividing the weight of the materials loaded into the container by the length of the circumference of an opening molded on the container and, when different values are obtained using the inner diameter of the container and the outer diameter of the container, the value obtained using the outer diameter is adopted.

As a method of controlling the loading weight per opening periphery to be in a desired range, any method can be employed as long as the phosphor of the present invention can be obtained, and examples thereof include, from the container standpoint, a method of modifying the outer circumferential length or the aspect ratio of the opening of the container, a method of molding the container to have a narrow opening, and a method of molding an opening to have a corrugated shape; and, from the loading weight standpoint, a method of changing the loading weight, and a method of changing the bulk density of the phosphor raw material mixture by powder compaction or the like.

Further, as long as the atmosphere inside the container is appropriately maintained, other method of adjusting the loading weight per opening periphery, examples of which include a method of arranging an obstacle between the opening and the loaded materials in the container, a method of storing the container into which the materials are loaded in another container, and a method of supplying an atmosphere from outside of the container.

The resulting fired product is in the form of granules or aggregates. This fired product is processed into a powder of a prescribed size by a combination of crushing, pulverization and/or classification operations. In this process, the fired product may be treated to have a D50 of about 30 μm or smaller.

Examples of a concrete treatment include a method of classifying the synthesis product through a sieve having a mesh size of about 45 μm and subjecting the powder passing through the sieve to a subsequent step; and a method of pulverizing the synthesis product to a prescribed particle size using a common pulverizer, such as a ball mill, a vibration mill or a jet mill. In the latter method, excessive pulverization results in not only the formation of microparticles that readily scatter light but also the generation of crystal defects on the particle surfaces, both of which can cause a reduction in the emission efficiency.

(Heat Treatment Step)

In order to produce the phosphor of the present invention, it is preferred to further perform a heat treatment on the phosphor obtained in the firing step (heat treatment step). This heat treatment step is performed for the purpose of thermally decomposing an oxynitride impurity phase. When the heat treatment step is performed, the ions unevenly distributed in the phosphor, such as $Eu^{2+}$, are more readily dispersed and the thermal decomposition of the impurity phase formed on the phosphor surface during the firing step is facilitated, so that the luminance can be improved.

An appropriate heating temperature in the heat treatment step varies depending on the atmosphere and the like; however, it is preferably in a range of 1,200° C. to 1,550° C. The decomposition of the impurity phase tends to proceed at a temperature of 1,200° C. or higher, while rapid decomposition of β-sialon can be suppressed at a temperature of 1,550° C. or lower.

Examples of an atmosphere for the heat treatment include a nitrogen atmosphere, a hydrogen-containing nitrogen atmosphere, an argon atmosphere, a hydrogen-containing argon atmosphere, and a vacuum atmosphere, among which an argon atmosphere is preferred.

The pressure during the heat treatment varies depending on the heating temperature and the like; however, it is usually 0.09 MPa or higher, preferably 0.1 MPa or higher, and the upper limit thereof is usually 1 MPa or lower, preferably 0.5 MPa or lower.

The heat treatment time varies depending on the temperature, the pressure and the like during the heat treatment; however, it is usually 10 minutes or longer, preferably 1 hour or longer, but usually not longer than 48 hours, preferably not longer than 24 hours.

With regard to loading of the phosphor obtained in the firing step into the container, by adjusting the loading weight per opening periphery of the container (g/mm) in the same manner as in the above-described firing step, the atmosphere inside the container is appropriately maintained during the heat treatment, and the thermal decomposition reaction of the impurity phase and the like are thereby facilitated to proceed uniformly, so that a phosphor having a small microstrain is likely to be obtained.

The firing step and the heat treatment step may be performed in succession by performing the heat treatment step during cooling after the heating in the firing step; however, it is more effective to perform the heat treatment after adjusting the fired product to have a prescribed particle size through crushing and pulverization after the firing step. The reason for this is because not only crystal defects that are formed during firing but also crystal defects that are formed during crushing and pulverization can thereby be removed.

In the production of the phosphor of the present invention, it is preferred to use, for example LaN as a flux (crystal growth aid) in the firing step. As the flux, in addition to LaN, for example, LaN, $AlF_3$ and/or $LaF_3$ may be used in combination.

(Washing Step)

On the surface of the β-sialon phosphor, metal Si and the like tend to be generated in the firing step and the heat treatment step. Therefore, in order to improve the properties of the phosphor, it is preferred to remove or reduce such metal Si and the like as much as possible. For this purpose, it is preferred to incorporate the washing step after the firing step and the heat treatment step. By the washing step, the metal Si and an impurity phase different therefrom, which are generated on the phosphor surface in the firing step and the heat treatment step, can be removed or reduced. As a result, an effect of reducing components that absorb the light emitted from the phosphor and thereby improving the emission characteristics is attained. In the present invention, a washing method is not particularly restricted as long as impurities can be removed or reduced. For example, washing can be performed using an alkaline solution, or a mixed solution of hydrofluoric acid and nitric acid.

It is noted here that, during immersion of the phosphor in an aqueous solution, the aqueous solution may be left to stand; however, from the standpoint of working efficiency, it is preferred to stir the aqueous solution to such an extent that the washing time can be shortened. Further, although the washing operation is usually performed at room temperature (about 25° C.), the aqueous solution may be heated as required.

The duration for which the phosphor is immersed varies depending on the stirring conditions and the like; however, it is usually 1 hour or longer, preferably 2 hours or longer, but usually not longer than 24 hours, preferably not longer than 12 hours.

A post-treatment step(s), such as the classification step and the drying step, may be further performed before or after the above-described steps.

{Phosphor-Containing Composition}

The phosphor of the present invention can be used being mixed with a liquid medium. Particularly, when the phosphor of the present invention is used in an application such as a light-emitting device, the phosphor is preferably used in the form of being dispersed in a liquid medium. A composition obtained by dispersing the phosphor of the present invention in a liquid medium is hereinafter referred to as "phosphor-containing composition of the present invention"

[Phosphor]

The type of the phosphor of the present invention contained in the phosphor-containing composition of the present invention is not restricted, and can be arbitrarily selected from the above-described types. Further, the phosphor of the present invention contained in the phosphor-containing composition of the present invention may be of a single type, or two or more types thereof may be used in any combination and at any ratio. Moreover, in the phosphor-containing composition of the present invention, a phosphor other than the phosphor of the present invention may also be incorporated as long as it does not markedly impair the effects of the present invention.

[Liquid Medium]

The liquid medium used in the phosphor-containing composition of the present invention is not particularly restricted as long as it does not impair the performance of the phosphor of the present invention in an intended range. For example, any inorganic material and/or organic material can be used as long as the material(s) exhibit liquid properties under the desired use conditions and can suitably disperse the phosphor of the present invention without inducing an undesirable reaction. Examples of such a liquid medium include silicone resins, epoxy resins, and polyimide silicone resins.

[Content Ratio of Liquid Medium and Phosphor]

In the phosphor-containing composition of the present invention, the phosphor and the liquid medium may have any content ratio as long as the effects of the present invention are not markedly impaired; however, the content ratio of the liquid medium is usually 50% by mass or higher, preferably 75% by mass or higher, but usually 99% by mass or lower, preferably 95% by mass or lower, with respect to the whole phosphor-containing composition of the present invention.

[Other Components]

In the phosphor-containing composition of the present invention, in addition to the phosphor and the liquid medium, other components may also be incorporated as long as they do not markedly impair the effects of the present invention. Any one of such other components may be used alone, or two or more thereof may be used in any combination and at any ratio.

{Light-Emitting Device}

The light-emitting device of the present invention (hereinafter, also referred to as "light-emitting device" as appropriate) is a light-emitting device including: a first illuminant (excitation light source); and a second illuminant that emits a visible light when irradiated with a light emitted from the first illuminant, wherein the second illuminant contains at least one type of the phosphor of the present invention as a first phosphor. Here, any one type of the phosphor of the present invention may be used alone, or two or more thereof may be used in any combination and at any ratio.

[Phosphor]
(First Phosphor)

As the β-sialon phosphor of the present invention, for example, a phosphor that emits fluorescence in a green region when irradiated with a light from an excitation light source is used. Specifically, in the case of constituting a light-emitting device, the β-sialon phosphor of the present invention preferably has an emission peak in a wavelength range of 500 nm or more to 560 nm or less.

Modes of a light-emitting device will now be described for a case where the phosphor of the present invention has an emission peak in a wavelength range of 500 nm or more to 560 nm or less and an illuminant having an emission peak in a wavelength range of 300 nm or more to 500 nm or less is used as the first illuminant; however, the present embodiment is not restricted thereto.

In the above-described case, the light-emitting device of the present invention can take the following mode.

That is, the light-emitting device of the present invention may adopt a mode in which an illuminant having an emission peak in a wavelength range of 300 nm or more to 500 nm or less is used as the first illuminant, and at least one phosphor having an emission peak in a wavelength range of 500 nm or more to 560 nm or less (the phosphor of the present invention) and a phosphor having an emission peak in a wavelength range of 580 nm or more to 680 nm or less (red phosphor) are used as first and second phosphors contained in the second illuminant, respectively.

(Red Phosphor)

As the red phosphor in the above-described mode, for example, any of the following phosphors can be preferably used.

Examples of an Mn-activated fluoride phosphor include $K_2(Si,Ti)F_6:Mn$ and $K_2Si_{1-x}Na_xAl_xF_6:Mn$ (0<x<1);

examples of a sulfide phosphor include (Sr,Ca)S:Eu (CAS phosphor) and $La_2O_2S:Eu$ (LOS phosphor);

examples of a garnet-based phosphor include (Y,Lu,Gd,Tb)$_3$Mg$_2$AlSi$_2$O$_{12}$:Ce;

examples of a nanoparticle include CdSe; and examples of a nitride or oxynitride phosphor include (Sr,Ca)AlSiN$_3$:Eu (S/CASN phosphor), (CaAlSiN$_3$)$_{1-x}$·(SiO$_2$N$_2$)$_x$:Eu (CASON phosphor), (La,Ca)$_3$(Al,Si)$_6$N$_{11}$:Eu (LSN phosphor), (Ca,Sr,Ba)$_2$Si$_5$(N,O)$_8$:Eu (258 phosphor), (Sr,Ca)Al$_{1+x}$Si$_{4-x}$O$_x$N$_{7-x}$:Eu (1147 phosphor), M$_x$(Si,Al)$_{12}$(O,N)$_{16}$:Eu (wherein, M represents Ca, Sr or the like) (α-sialon phosphor), and Li(Sr,Ba)Al$_3$N$_4$:Eu (0<x<1 in all of the above-described phosphors).

(Yellow Phosphor)

In the above-described mode, a phosphor having an emission peak in a range of 550 to 580 nm (yellow phosphor) may also be used as required.

As the yellow phosphor, for example, any of the following phosphors can be preferably used.

Examples of garnet-based phosphor include (Y,Gd,Lu,Tb,La)$_3$(Al,Ga)$_5$O$_{12}$:(Ce,Eu,Nd);

examples of an ortho-silicate include (Ba,Sr,Ca,Mg)$_2$SiO$_4$:(Eu,Ce); and examples of a nitride or oxynitride phosphor include (Ba,Ca,Mg) Si$_2$O$_2$N$_2$:Eu (SION-based phosphor), (Li,Ca)$_2$(Si,Al)$_{12}$(O,N)$_{16}$:(Ce,Eu) (α-sialon phosphor), and (Ca,Sr)AlSi$_4$(O,N)$_7$:(Ce,Eu) (1147 phosphor).

Among these phosphors, a garnet-based phosphor is preferred and, particularly, an YAG-based phosphor represented by Y$_3$Al$_5$O$_{12}$:Ce is most preferred.

[Configuration of Light-Emitting Device]

The configuration of the light-emitting device of the present invention is not restricted except that the light-emitting device includes a first illuminant (excitation light source) and uses at least the phosphor of the present invention as a second illuminant, and the light-emitting device of the present invention can take any known device configuration. Examples of the device configuration and embodiments of the light-emitting device include those described in Japanese Unexamined Patent Application Publication No. 2007-291352. In addition, the light-emitting device may be in the form of, for example, a shell, a cup, a chip-on-board, or a remote phosphor.

{Use of Light-Emitting Device}

The use of the light-emitting device of the present invention is not particularly restricted, and the light-emitting device can be used in a variety of fields where an ordinary light-emitting device is used. The phosphor of the present invention has a wide color reproduction range and exhibits high color rendering properties; therefore, it is particularly preferably used as a light source of an illumination device or an image display device.

{Illumination Device}

In the application of the light-emitting device of the present invention to an illumination device, the light-emitting device may be used as a light source of a known illumination device. Examples of the illumination device include surface-emitting illumination devices in which a plurality of the light-emitting devices of the present invention are arranged on the bottom surface of a holding case.

{Image Display Device}

In the use of the light-emitting device of the present invention as a light source of an image display device, a concrete configuration of the image display device is not restricted; however, the light-emitting device is preferably used along with a color filter. For example, when the image display device is a color-image display device utilizing color liquid-crystal display elements, the image display device can be formed using the above-described light-emitting device as a backlight along with a combination of an optical shutter utilizing a liquid crystal and a color filter having red, green and blue pixels.

EXAMPLES

The present invention will now be described more concretely by way of Examples thereof, however, the present invention is not restricted to the below-described Examples within a range that does not depart from the gist of the present invention.

{Measurement Methods}

The emission characteristics and the like of the phosphors of Examples and Comparative Examples were measured by the following methods.

[Emission Full Width at Half Maximum, Chromaticity, Relative Luminance]

An emission spectrum was measured at room temperature (25° C.) using a fluorescence spectrometer FP6500 (manufactured by JASCO Corporation) equipped with a 150-W xenon lamp as an excitation light source and a multi-channel CCD detector C7041 (manufactured by Hamamatsu Photonics K.K.) as a spectrometer. The emission full width at half maximum was calculated from the thus obtained emission spectrum.

As for the chromaticity coordinates of an x-y color system (CIE 1931 color system), the chromaticity coordinates x and y in the XYZ color system prescribed in JIS Z8701 (1999) were calculated by a method conforming to JIS Z8724 (1997) from the data of the above-obtained emission spectrum in a wavelength range of 480 nm to 780 nm.

The luminance was calculated from a stimulus value Y in an XYZ color system determined in accordance with JIS Z8724, within a range that excludes an excitation wavelength region from an emission spectrum obtained by the above-described method for each produced phosphor that was irradiated with an excitation light having a wavelength of 455 nm. The relative luminance is a value determined by taking the luminance of the phosphor obtained in Example 1 as 100%.

[Microstrain and Crystallite Size]

In accordance with the above-described methods described in Reference Documents 1 and 2, the crystallite size and the microstrain were calculated by the Halder-Wagner method using an analysis software RIETAN-FP Ver. 2.71 after obtaining data of a powder X-ray diffraction (XRD) spectrum using a powder X-ray diffractometer X'Pert PRO MPD (manufactured by PANalytical Ltd.).

The measurement conditions were as follows.
Using a CuKα ray-including X-ray tube,
Goniometer radius=240 mm;
Incident-side slit=10 mm;
Solar slit=0.04 rad;
Step width=0.008°; and
Operating range 2θ=10 to 150°

{Phosphor Production}

Comparative Example 1

<Preparation of Pulverized Powder>

An α-type silicon nitride powder "SN-E10" Grade (manufactured by Ube Industries, Ltd.), an aluminum nitride powder "E" Grade (manufactured by Tokuyama Corporation), an aluminum oxide powder "TM-DAR" (manufactured by Taimei Chemicals Co., Ltd.), and an europium oxide powder "RU" Grade (manufactured by Shin-Etsu Chemical Co., Ltd.) were weighed in the respective formulation amounts shown in Table 1 and mixed using a mortar, after which the whole amount of the resultant was passed through a sieve having a mesh size of 450 μm and thereby further mixed to obtain a raw material mixed powder for pulverized powder.

TABLE 1

| Composition in Formula [1] | | | | | Raw material ratio (% by weight) | | | |
|---|---|---|---|---|---|---|---|---|
| a | b | c | d | e | $Si_3N_4$ | AlN | $Al_2O_3$ | $Eu_2O_3$ |
| 0.013 | 5.75 | 0.25 | 0.08 | 7.88 | 95.43 | 3.0394 | 0.7402 | 0.7905 |

The thus obtained raw material mixed powder for pulverized powder was loaded to a boron nitride crucible and fired by maintaining the crucible in a 0.85-MPa nitrogen atmosphere at 1,950° C. for 15 hours, after which the thus fired mixed powder was pulverized using a supersonic jet pulverizer (pulverization air pressure: 0.3 MPa) to obtain a pulverized powder.

<Preparation of Phosphor Raw Material Mixed Powder>

Raw materials and the above-obtained pulverized powder were weighed in the respective formulation amounts shown in Table 2 and mixed using a mortar, after which the whole amount of the resultant was passed through a sieve having a mesh size of 450 μm and thereby further mixed to obtain a raw material mixed powder.

TABLE 2

| Raw material ratio (% by weight) | | | | |
|---|---|---|---|---|
| $Si_3N_4$ | AlN | $Al_2O_3$ | $Eu_2O_3$ | Pulverized powder |
| 78.45 | 3.51 | 3.39 | 1.74 | 12.90 |

<Preparation of Phosphor>

The thus obtained raw material mixed powder was loaded to a boron nitride crucible in a loading weight per opening periphery of 0.03 g/mm and fired by maintaining the crucible in a 0.85-MPa nitrogen atmosphere at 1,950° C. for 15 hours, after which the thus fired mixed powder was crushed to obtain a phosphor of Comparative Example 1.

By performing powder X-ray diffractometry on the thus obtained phosphor of Comparative Example 1, it was confirmed that the phosphor of Comparative Example 1 had a β-sialon structure. In addition, the microstrain and the crystallite size were calculated from the results of the powder X-ray diffractometry and shown in Table 6.

Moreover, the relative luminance, the chromaticity, and the emission full width at half maximum were determined from emission of the phosphor of Comparative Example 1 and shown together in Table 6.

Example 1

A phosphor of Example 1 was obtained in the same manner by the following method, except that the loading weight per opening periphery was adjusted by changing the shape of the crucible used in Example 3 of Patent Document 3 and the mixing step was modified.

<Preparation of Phosphor Raw Material Mixed Powder>

Raw materials were weighed in the respective formulation amounts shown in Table 3 below, and aggregates thereof were crushed and mixed using a vibration mill, after which the whole amount of the resultant was passed through a sieve having a mesh size of 100 μm and thereby further thoroughly mixed to homogeneity, whereby a raw material mixed powder was obtained.

TABLE 3

| | Composition in Formula [1] | | | | | Raw material ratio (% by weight) | | | | |
|---|---|---|---|---|---|---|---|---|---|---|
| | a | b | c | d | e | $Si_3N_4$ | $SiO_2$ | AlN | $Al_2O_3$ | $Eu_2O_3$ |
| Example 1 | 0.013 | 5.75 | 0.25 | 0.05 | 7.89 | 95.50 | 0 | 3.3 | 0.40 | 0.80 |
| Examples 2 and 4 | 0.0175 | 5.75 | 0.25 | 0.05 | 7.90 | 95.23 | 0 | 3.41 | 0.27 | 1.09 |
| Example 3 | 0.009 | 5.86 | 0.14 | 0.01 | 7.95 | 97.40 | 0 | 2.04 | 0 | 0.56 |
| Example 5 | 0.0175 | 5.75 | 0.25 | 0.05 | 7.90 | 95.03 | 0.25 | 3.63 | 0 | 1.09 |

<Preparation of Phosphor>

The thus obtained raw material mixed powder was loaded to a boron nitride crucible in a loading weight per opening periphery of 0.6 g/mm and fired by maintaining the crucible in a 0.9-MPa nitrogen atmosphere at 1,950° C. for 12 hours and then in an atmospheric-pressure argon atmosphere at 1,450° C. for 8 hours, after which the thus fired mixed powder was crushed to obtain a heat-treated powder. This heat-treated powder was washed and then dried, whereby the phosphor of Example 1 was obtained.

By performing powder X-ray diffractometry on the phosphor of Example 1, it was confirmed that the phosphor of Example 1 had a β-sialon structure. In addition, the microstrain and the crystallite size were calculated from the results of the powder X-ray diffractometry and shown in Table 6.

Moreover, the relative luminance, the chromaticity, and the emission full width at half maximum were determined from emission of the phosphor of Example 1 and shown together in Table 6.

Example 2

Raw materials were weighed in the respective formulation amounts shown in Table 3 above and thoroughly mixed to homogeneity using a mixer, whereby a raw material mixed powder was obtained.

The thus obtained raw material mixed powder was loaded to a boron nitride crucible in a loading weight per opening periphery of 1.3 g/mm and fired by maintaining the crucible in a 1.0-MPa nitrogen atmosphere at 2,030° C. for 12 hours to obtain a fired product.

Thereafter, the thus obtained fired product was maintained in a 0.205-MPa argon atmosphere at 1,450° C. for 12 hours and subsequently crushed to obtain a heat-treated powder. This heat-treated powder was washed and then dried, whereby a phosphor of Example 2 was obtained.

By performing powder X-ray diffractometry on the phosphor of Example 2, it was confirmed that the phosphor of Example 2 had a β-sialon structure. In addition, the microstrain and the crystallite size were calculated from the results of the powder X-ray diffractometry and shown in Table 6.

Moreover, the relative luminance, the chromaticity, and the emission full width at half maximum were determined from emission of the phosphor of Example 2 and shown together in Table 6.

Example 3

Raw materials were weighed in the respective formulation amounts shown in Table 3 above and thoroughly mixed to homogeneity using a mixer, whereby a raw material mixed powder was obtained.

A phosphor of Example 3 was obtained in the same manner as in Example 2, except that the thus obtained raw material mixed powder was loaded to a boron nitride crucible in a loading weight per opening periphery of 1.0 g/mm and fired by maintaining the crucible at 2,040° C. for 8 hours.

By performing powder X-ray diffractometry on the phosphor of Example 3, it was confirmed that the phosphor of Example 3 had a β-sialon structure. In addition, the microstrain and the crystallite size were calculated from the results of the powder X-ray diffractometry and shown in Table 6.

Moreover, the relative luminance, the chromaticity, and the emission full width at half maximum were determined from emission of the phosphor of Example 3 and shown together in Table 6.

Example 4

A fired product was obtained in the same manner as in Example 2, except that the raw material mixed powder was loaded to a boron nitride crucible in a loading weight per opening periphery of 1.1 g/mm and fired by maintaining the crucible at 1,900° C. for 8 hours, and this fired product was subsequently crushed to obtain a fired powder. The thus obtained fired powder was loaded to a boron nitride crucible and further fired by maintaining the crucible in a 1.0-MPa nitrogen atmosphere at 2,030° C. for 12 hours, whereby a fired product was obtained.

Thereafter, the thus obtained fired product was maintained in a 0.205-MPa argon atmosphere at 1,450° C. for 12 hours and subsequently crushed to obtain a heat-treated powder. This heat-treated powder was washed and then dried, whereby a phosphor of Example 4 was obtained.

By performing powder X-ray diffractometry on the phosphor of Example 4, it was confirmed that the phosphor of Example 4 had a β-sialon structure. In addition, the microstrain and the crystallite size were calculated from the results of the powder X-ray diffractometry and shown in Table 6.

Moreover, the relative luminance, the chromaticity, and the emission full width at half maximum were determined from emission of the phosphor of Example 4 and shown together in Table 6.

Example 5

Raw materials were weighed in the respective formulation amounts shown in Table 3 above and thoroughly mixed to homogeneity using a mixer, whereby a raw material mixed powder was obtained. It is noted here that "SO-E5" Grade (manufactured by Admatechs Co., Ltd.) was used as a silicon oxide powder.

A phosphor of Example 5 was obtained in the same manner as in Example 2, except that the thus obtained raw material mixed powder was loaded to a boron nitride crucible in a loading weight per opening periphery of 1.1 g/mm and fired by maintaining the crucible at 2,025° C. for 18 hours.

By performing powder X-ray diffractometry on the phosphor of Example 5, it was confirmed that the phosphor of Example 5 had a β-sialon structure. In addition, the microstrain and the crystallite size were calculated from the results of the powder X-ray diffractometry and shown in Table 6.

Moreover, the relative luminance, the chromaticity, and the emission full width at half maximum were determined from emission of the phosphor of Example 5 and shown together in Table 6.

Example 6

<Preparation of Pulverized Powder>

Raw materials were weighed in the respective formulation amounts shown in Table 4 below and thoroughly mixed to homogeneity using a mixer, whereby a raw material mixed powder for pulverized powder was obtained.

TABLE 4

| | Composition in Formula [1] | | | | | Raw material ratio (% by weight) | | | |
|---|---|---|---|---|---|---|---|---|---|
| | a | b | c | d | e | $Si_3N_4$ | AlN | $Al_2O_3$ | $Eu_2O_3$ |
| Examples 6 and 7 | 0.0175 | 5.75 | 0.25 | 0.04 | 7.91 | 95.25 | 3.51 | 0.14 | 1.09 |

The thus obtained raw material mixed powder for pulverized powder was loaded to a boron nitride crucible and fired by maintaining the crucible in a 1.0-MPa nitrogen atmosphere at 2,030° C. for 10 hours, after which the thus fired mixed powder was pulverized to obtain a pulverized powder of Example 6.

<Preparation of Phosphor Raw Material Mixed Powder>

In a mixing container, raw materials and the above-obtained pulverized powder were weighed in the respective formulation amounts shown in Table 5 and, after vibrating this mixing container, the whole amount of the weighed materials was passed through a sieve having a mesh size of 900 μm and thereby mixed to obtain a raw material mixed powder.

TABLE 5

| | Raw material ratio (% by weight) | | | | |
|---|---|---|---|---|---|
| | $Si_3N_4$ | AlN | $Al_2O_3$ | $Eu_2O_3$ | Pulverized powder |
| Examples 6 and 7 | 85.70 | 3.07 | 0.24 | 0.98 | 10.00 |
| Example 8 | 92.37 | 3.31 | 0.26 | 1.06 | 3.00 |

<Preparation of Phosphor>

A phosphor of Example 6 was obtained in the same manner as in Example 2, except that the thus obtained raw material mixed powder was loaded to a boron nitride crucible in a loading weight per opening periphery of 1.1 g/mm and fired by maintaining the crucible at 2,030° C. for 12 hours.

By performing powder X-ray diffractometry on the phosphor of Example 6, it was confirmed that the phosphor of Example 6 had a β-sialon structure. In addition, the microstrain and the crystallite size were calculated from the results of the powder X-ray diffractometry and shown in Table 6.

Moreover, the relative luminance, the chromaticity, and the emission full width at half maximum were determined from emission of the phosphor of Example 6 and shown together in Table 6.

Example 7

A phosphor of Example 7 was obtained in the same manner as in Example 6, except that the obtained raw material mixed powder was loaded to a boron nitride crucible in a loading weight per opening periphery of 0.7 g/mm and fired by maintaining the crucible at 2,000° C. for 12 hours.

By performing powder X-ray diffractometry on the phosphor of Example 7, it was confirmed that the phosphor of Example 7 had a β-sialon structure. In addition, the microstrain and the crystallite size were calculated from the results of the powder X-ray diffractometry and shown in Table 6.

Moreover, the relative luminance, the chromaticity, and the emission full width at half maximum were determined from emission of the phosphor of Example 7 and shown together in Table 6.

Example 8

<Preparation of Pulverized Powder>

Raw materials were weighed in the respective formulation amounts shown in Table 4 above and thoroughly mixed to homogeneity using a mixer, whereby a raw material mixed powder for pulverized powder was obtained.

The thus obtained raw material mixed powder for pulverized powder was loaded to a boron nitride crucible and fired by maintaining the crucible in a 1.0-MPa nitrogen atmosphere at 2,025° C. for 18 hours and then in a 0.205-MPa argon atmosphere at 1,450° C. for 12 hours, after which the thus fired mixed powder was crushed to obtain a heat-treated powder. This heat-treated powder was pulverized to obtain a pulverized powder.

<Preparation of Phosphor Raw Material Mixed Powder>

In a mixing container, raw materials and the above-obtained pulverized powder were weighed in the respective formulation amounts shown in Table 5, and the weighed materials were subsequently mixed by vibrating the mixing container to obtain a raw material mixed powder.

<Preparation of Phosphor>

A phosphor of Example 8 was obtained in the same manner as in Example 2, except that the obtained raw material mixed powder was loaded to a boron nitride crucible in a loading weight per opening periphery of 1.1 g/mm and fired by maintaining the crucible at 2,050° C. for 2 hours.

By performing powder X-ray diffractometry on the phosphor of Example 8, it was confirmed that the phosphor of Example 8 had a β-sialon structure. In addition, the microstrain and the crystallite size were calculated from the results of the powder X-ray diffractometry and shown in Table 6.

Moreover, the relative luminance, the chromaticity, and the emission full width at half maximum were determined from emission of the phosphor of Example 8 and shown together in Table 6.

TABLE 6

| Phosphor | Loading weight per opening periphery (g/mm) | Firing temperature* (°C.) | Crystallite size (nm) | Microstrain (%) | Relative luminance (%) | Chromaticity x | Chromaticity y | Emission full width at half maximum (nm) |
|---|---|---|---|---|---|---|---|---|
| Comparative Example 1 | 0.03 | 1,950 | 92 | 0.057 | 25 | 0.317 | 0.641 | 56 |
| Example 1 | 0.6 | 1,950 | 107 | 0.021 | 100 | 0.347 | 0.630 | 55 |
| Example 2 | 1.3 | 2,030 | 115 | 0.018 | 152 | 0.358 | 0.624 | 53 |
| Example 3 | 1.0 | 2,040 | 109 | 0.015 | 125 | 0.331 | 0.644 | 51 |
| Example 4 | 1.1 | 2,030 | 111 | 0.015 | 141 | 0.357 | 0.625 | 53 |
| Example 5 | 1.1 | 2,025 | 106 | 0.002 | 137 | 0.355 | 0.626 | 53 |
| Example 6 | 1.1 | 2,030 | 108 | 0.040 | 134 | 0.352 | 0.629 | 53 |
| Example 7 | 0.7 | 2,000 | 104 | 0.036 | 142 | 0.360 | 0.622 | 54 |
| Example 8 | 1.1 | 2,050 | 114 | 0.032 | 127 | 0.362 | 0.621 | 53 |

*Indicates the highest firing temperature for those cases where firing was performed plural times.

From Table 6, it is seen that the microstrain was reduced by increasing the loading weight per opening periphery. In addition, from Table 6, it is seen that the relative luminance had a tendency of being enhanced when the loading weight per opening periphery was increased and the firing temperature was raised to the vicinity of immediately below a decomposition temperature.

{Evaluation of LED Properties}
(Production of Light-Emitting Devices)

Each of the phosphors of Comparative Example 1 and Examples 1 to 8 and a CASN phosphor (BR101/B, manufactured by Mitsubishi Chemical Corporation) were dispersed in a silicone resin KER-2500 (manufactured by Shin-Etsu Chemical Co., Ltd.), which contained 5% of AEROSIL (RX200) as a thickening agent, to prepare phosphor-containing compositions. An InGaN-based blue LED chip was mounted in a package and sealed with the above-described silicone resin in which each phosphor had been dispersed (phosphor-containing composition), whereby white LEDs of Comparative Example 1 and Examples 1 to 8 containing the respective phosphors of Comparative Example 1 and Examples 1 to 8 were obtained. It is noted here that these white LED were adjusted to have an emission chromaticity (x,y) of about x=0.255 and y=0.225.

(Measurement of Emission Efficiency and LED Durability Test)

Each light-emitting device was energized with a current of 350 mA, and the LED luminous flux and the emission spectrum were measured at an energizing time of 0 hours using a spectrophotometer equipped with an integrating sphere. The values of the relative LED luminous flux are shown in Table 7, taking the LED luminous flux of Example 1 as 100%. In addition, a graph obtained by plotting the values of the relative LED luminous flux against the values of the relative luminance is shown in FIG. 1.

Figure 2:
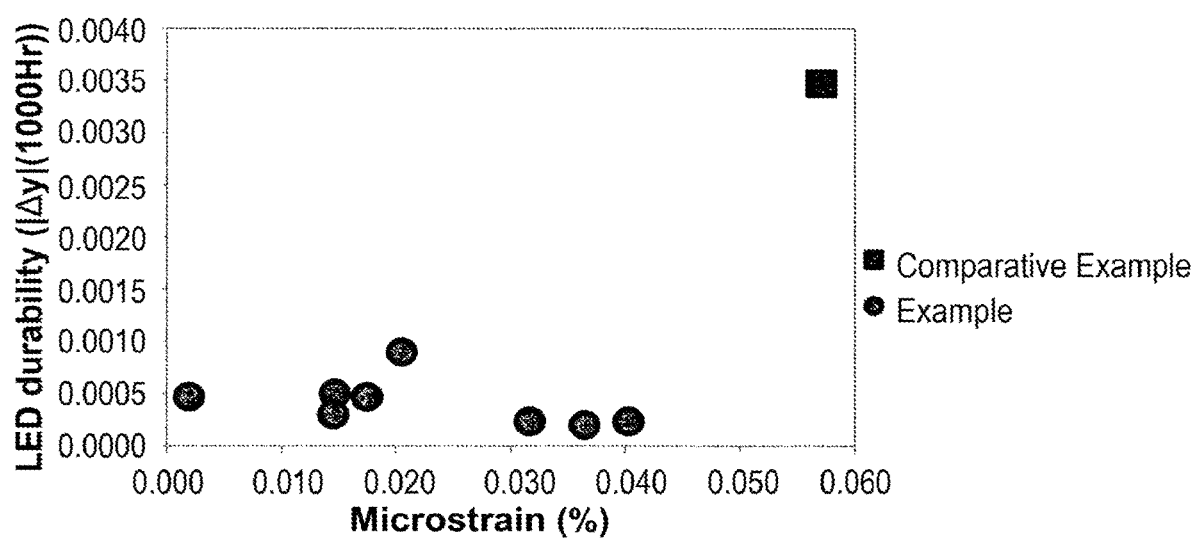
FIG. 2 is a graph obtained by plotting the values of LED durability |Δy| (1,000 hr) against the values of microstrain for the phosphors obtained in Examples and Comparative Examples.

Subsequently, in an incubator set at a temperature of 85° C. and a relative humidity of 85%, each white LED was continuously energized with a current of 350 mA and taken out of the incubator at time points of 200 hours, 500 hours and 1,000 hours from the initiation of the energization, and the LED luminous flux and the emission spectrum were measured in the same manner as the measurement performed at the time point of 0 hours. Absolute values of the change in chromaticity coordinate y from the time point of 0 hours, |Δy|, are shown in Table 7. In addition, a graph obtained by plotting the values of the LED durability |Δy| against the values of microstrain is shown in FIG. 2.

TABLE 7

| Phosphor | Relative LED luminous flux (Lm/W) | LED durability |Δy| (200 Hr) | |Δy| (500 Hr) | |Δy| (1,000 Hr) | Lm/W retention rate (1,000 Hr) |
|---|---|---|---|---|---|
| Comparative Example 1 | 41 | 0.00243 | 0.00300 | 0.00347 | 101.2 |
| Example 1 | 100 | 0.00140 | 0.00123 | 0.00090 | 98.9 |
| Example 2 | 115 | 0.00147 | 0.00103 | 0.00047 | 99.2 |
| Example 3 | 103 | 0.00067 | 0.00000 | 0.00050 | 100.1 |
| Example 4 | 113 | 0.00067 | 0.00013 | 0.00030 | 99.0 |
| Example 5 | 101 | — | — | 0.00047 | 98.3 |
| Example 6 | 115 | 0.00037 | 0.00003 | 0.00023 | 99.5 |
| Example 7 | 118 | 0.00060 | 0.00027 | 0.00020 | 99.0 |
| Example 8 | 118 | 0.00010 | 0.00023 | 0.00023 | 99.5 |

From Table 6 and FIG. 1, it is seen that the relative LED luminous flux was increased as the relative luminance increased. From Table 6 and FIG. 2, it is seen that the LED durability |Δy| was reduced as the microstrain decreased. From these results, it is seen that a phosphor having a high relative luminance and a small microstrain has both a high relative LED luminous flux and a good LED durability |Δy| at the same time.

As shown above, it is seen that a light-emitting device using the phosphor of the present invention has a high emission efficiency and excellent reliability.

The invention claimed is:

1. A phosphor comprising a crystal phase represented by the following Formula [1] and having a microstrain of 0.020% or less as calculated by the Halder-Wagner method:

$$Eu_aSi_bAl_cO_dN_e \quad [1]$$

wherein, a, b, c, d, and e represent values satisfying the following respective ranges:
0<a≤0.2,
5.6<b≤5.994,
0.006≤c<0.4,
b+c=6,
0.006≤d<0.4, and
7.6<e≤7.994.

2. The phosphor according to claim 1, having a crystallite size of 100 nm or larger.

3. The phosphor according to claim 1, wherein the microstrain is not less than 0.002%.

4. The phosphor according to claim 1, exhibiting an emission peak in a wavelength range of 500 nm or more to 560 nm or less when irradiated with an excitation light having a wavelength of 300 nm or more to 500 nm or less.

5. The phosphor according to claim 1, having a full width at half maximum of 55 nm or smaller in an emission spectrum.

6. A light-emitting device comprising:
a first illuminant; and
a second illuminant that emits a visible light when irradiated with a light emitted from the first illuminant,
wherein the second illuminant comprises, as a first phosphor, at least one phosphor according to claim 1.

7. An illumination device comprising the light-emitting device according to claim 6 as a light source.

8. An image display device comprising the light-emitting device according to claim 6 as a light source.

9. The phosphor according to claim 2, which has a crystallite size of 105 nm or larger.

10. The phosphor according to claim 2, which has a crystallite size of 108 nm or larger.

11. The phosphor according to claim 2, which has a crystallite size of 100 nm to 1,000 nm.

\* \* \* \* \*